(12) United States Patent
Fujiwara et al.

(10) Patent No.: US 8,230,274 B2
(45) Date of Patent: Jul. 24, 2012

(54) JTAG CONTROLLED SELF-REPAIR AFTER PACKAGING

(75) Inventors: Yoshinori Fujiwara, Tsukuba (JP); Masayoshi Nomura, Ryugasaki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/358,442

(22) Filed: Jan. 25, 2012

(65) Prior Publication Data

US 2012/0120749 A1    May 17, 2012

Related U.S. Application Data

(63) Continuation of application No. 12/906,764, filed on Oct. 18, 2010, now Pat. No. 8,122,304, which is a continuation of application No. 12/764,810, filed on Apr. 21, 2010, now Pat. No. 7,831,870, which is a continuation of application No. 11/789,367, filed on Apr. 23, 2007, now Pat. No. 7,721,163.

(51) Int. Cl.
*G11C 29/00* (2006.01)
*G11C 17/18* (2006.01)
*G01R 31/28* (2006.01)

(52) U.S. Cl. ........ 714/710; 714/711; 714/718; 714/726; 714/727; 365/201; 365/225.7

(58) Field of Classification Search ................... 714/710, 714/711, 718, 726, 727; 365/201, 225.7
See application file for complete search history.

(56) References Cited

U.S. PATENT DOCUMENTS

| | | | |
|---|---|---|---|
| 5,325,368 A | 6/1994 | James et al. | |
| 5,377,146 A | 12/1994 | Reddy et al. | |
| 5,657,280 A * | 8/1997 | Shin et al. | 365/200 |
| 6,243,842 B1 | 6/2001 | Slezak et al. | |
| 6,300,769 B1 | 10/2001 | Phan | |
| 6,430,100 B2 | 8/2002 | Kim | |
| 6,439,046 B1 | 8/2002 | Kruspe et al. | |
| 6,445,627 B1 | 9/2002 | Nakahara et al. | |
| 6,462,684 B1 | 10/2002 | Medelius et al. | |
| 6,473,352 B2 * | 10/2002 | Nishino et al. | 365/219 |
| 6,505,313 B1 | 1/2003 | Phan et al. | |
| 6,560,740 B1 | 5/2003 | Zuraski, Jr. et al. | |
| 6,675,334 B2 | 1/2004 | Wadley | |
| 6,771,549 B1 | 8/2004 | Konuk et al. | |
| 6,871,297 B2 | 3/2005 | Puri et al. | |
| 6,898,143 B2 | 5/2005 | Puri et al. | |
| 6,928,598 B1 | 8/2005 | Agrawal et al. | |
| 6,940,765 B2 | 9/2005 | Kyung | |
| 6,940,766 B2 | 9/2005 | Konuk et al. | |
| 7,007,211 B1 | 2/2006 | White et al. | |
| 7,076,699 B1 | 7/2006 | Puri et al. | |

(Continued)

FOREIGN PATENT DOCUMENTS

KR    2000-0038417    7/2000

*Primary Examiner* — John J Tabone, Jr.
(74) *Attorney, Agent, or Firm* — Dorsey & Whitney LLP

(57) ABSTRACT

An integrated circuit containing memory includes IEEE 1149.1 (JTAG) controlled self-repair system that permits permanent repair of the memory after the integrated circuit has been packaged. The JTAG controlled self-repair system allows a user to direct circuitry to blow fuses using an externally supplied voltage to electrically couple or isolate components to permanently repair a memory location with JTAG standard TMS and TCK signals. The system may optionally sequentially repair more than one memory location using a repair sequencer.

15 Claims, 4 Drawing Sheets

U.S. PATENT DOCUMENTS

| | | |
|---|---|---|
| 7,088,627 B1 | 8/2006 | Bajwa et al. |
| 7,127,647 B1 | 10/2006 | Zorian et al. |
| 7,149,921 B1 | 12/2006 | Zorian et al. |
| 7,149,924 B1 | 12/2006 | Zorian et al. |
| 7,174,486 B2 | 2/2007 | Adams et al. |
| 7,185,243 B1 | 2/2007 | Puri et al. |
| 7,251,756 B2 | 7/2007 | Anand et al. |
| 7,529,996 B2 | 5/2009 | Whetsel |
| 7,721,163 B2 | 5/2010 | Fujiwara et al. |
| 7,757,135 B2 * | 7/2010 | Nadeau-Dostie et al. .... 714/723 |
| 8,046,648 B1 * | 10/2011 | Russell .................. 714/726 |
| 2003/0146454 A1 | 8/2003 | Sasaki et al. |
| 2007/0047343 A1 | 3/2007 | Adams et al. |
| 2008/0209283 A1 | 8/2008 | Gupta et al. |
| 2008/0263392 A1 | 10/2008 | Fujiwara et al. |
| 2010/0205489 A1 | 8/2010 | Fujiwara et al. |

* cited by examiner

US 8,230,274 B2

JTAG CONTROLLED SELF-REPAIR AFTER PACKAGING

CROSS-REFERENCE TO RELATED APPLICATIONS

This application is a continuation of U.S. patent application Ser. No. 12/906,764, filed Oct. 18, 2010, U.S. Pat. No. 8,122,304, which is a continuation of U.S. patent application Ser. No. 12/764,810, filed Apr. 21, 2010, U.S. Pat. No. 7,831,870, which is a continuation of U.S. patent application Ser. No. 11/789,367, filed Apr. 23, 2007, U.S. Pat. No. 7,721,163. These applications and patents are incorporated by reference herein, in their entirety, and for any purpose.

TECHNICAL FIELD

Embodiments of this invention relate to self-repair of memories, and, more particularly, to IEEE 1149.1 (JTAG) controlled self-repair after packaging.

BACKGROUND OF THE INVENTION

Fabrication of semiconductor memory devices and other semiconductor devices containing memory is an imperfect process. The imperfections in the fabrication process lead inevitably to imperfections in the semiconductor devices themselves. Such imperfections might manifest themselves as, for example, semiconductor crystallinity defects or electrical connector discontinuities. Naturally, such imperfections in the semiconductor devices can lead to errors in storing and retrieving data from memory cells contained within such semiconductor devices. For this reason, it is necessary to test each and every memory cell on a semiconductor device after fabrication and prior to selling such devices to manufacturers and other end users for use in electronic systems.

Semiconductor and memory device testing was originally only intended to identify faulty devices which were then discarded. As memory cell density has increased, however, the failure rates of devices containing memory cells can become intolerably large leading to too many devices being discarded. In an effort to improve device yields, methods for repairing defective devices have been developed. More specifically, semiconductor devices with repairable memory typically include redundant rows or columns of memory cells. During testing of such devices, the addresses of the faulty rows, columns or cells are identified and the addresses saved. These faulty memory rows, columns or cells are then effectively replaced by one of the redundant rows, columns. This is typically accomplished through the use of fuses or anti-fuses (hereinafter referred to collectively as 'fuses') which are used to create open and closed circuit paths within the memory or its associated decoders. Through the use of a laser, an appropriate combination of fuses can be "blown" thereby electrically isolating defective cells while electrically connecting the redundant cells in their place.

Most typically, both the testing and repair of semiconductor devices has been accomplished through the use of complex test equipment that is physically connected to each memory die. Moreover, it is not uncommon that testing of the devices is done on one piece of equipment and the repair on another. Obviously, testing, repairing and then retesting of the repaired devices takes a great deal of time when the devices have to be moved from one machine to another. To help mitigate this problem, test and repair circuitry can be built into the semiconductor device itself. Built-in self test (BIST) and built-in self repair (BISR) capabilities within semiconductor devices containing memory can increase device yields in a time efficient manner.

Validation and repair of prior art semiconductor devices using BIST and BISR still generally requires the use of a test machine. The test machine is used to electrically interface with a device die. Once the test machine is connected, the machine is used to issue a test mode command to the die. This mode is used to enable the BIST circuitry to run test patterns against the memory cells and other circuitry. When a test failure occurs, the BIST circuitry in the device captures the address of any memory failures. Once the address or addresses have been captured, the test machine issues may be used to control and direct the repair with, for example, a laser repair machine. After repair is complete, the test machine is typically used to run the test patterns again to ensure the repair was completed properly and otherwise verify the integrity of the device.

An example of a prior art repair system is illustrated in FIG. 1. A die 100 includes a memory array 140, row and column decoders 120, redundant row and column decoders 125 and a control module 110. The integrated circuit die 100 may optionally contain other logic or an application specific integrated circuit (ASIC) 145. As was described above, a Test and Repair Machine 105 interfaces directly with the integrated circuit die 100. The Test and Repair Machine 105 may, for example, run tests on the memory array 140 and related circuitry. A typical test might write data to the memory array 140 and then later read the data. A test comparator 1130 would then compare the read data with the data that was written to determine if there has been an error. If so, an error flag is generated and routed to the control module 210. The error flag may be used by the control module 210 for storing the failure address within the control module 210 or elsewhere on the device. Alternatively, the error flag may be routed directly to the test and repair machine 105 and the machine 105 can store the failure address. The failure address, whether stored internally or externally, may be used to program a fuse bank in the redundant row and column decoders 125 with, for example, an external laser repair machine as was discussed above. Once the appropriate fuses have been programmed, the redundant row and column decoders 125 are able to replace a received address of the faulty memory cells with an address of redundant cells in the memory array 140.

Although this process of validation and repair has increased chip yields and testing efficiency, it is not without certain drawbacks. Most notably, the prior art repair circuitry may only be accessed at the die level by a test machine. That is, once the die has been packaged into, for example, a single inline package (SIP), the repair circuitry (e.g. a fuse) is no longer easily accessible and further repairs to the memory are not easily made. Semiconductor devices containing memory may, however, develop further faults during the packaging process or in subsequent use. The current technology does not allow for the packaged devices to be easily repaired. Memory manufacturers and customers who use the final packaged devices cannot, therefore, easily repair memory within these faulty devices. If such failures could easily be repaired after sale, customer yield would be desirably improved.

There is therefore a need for a system for accessing and controlling the repair circuitry of semiconductor devices containing memory after the devices have been packaged.

DETAILED DESCRIPTION OF THE INVENTION

Figure 1:
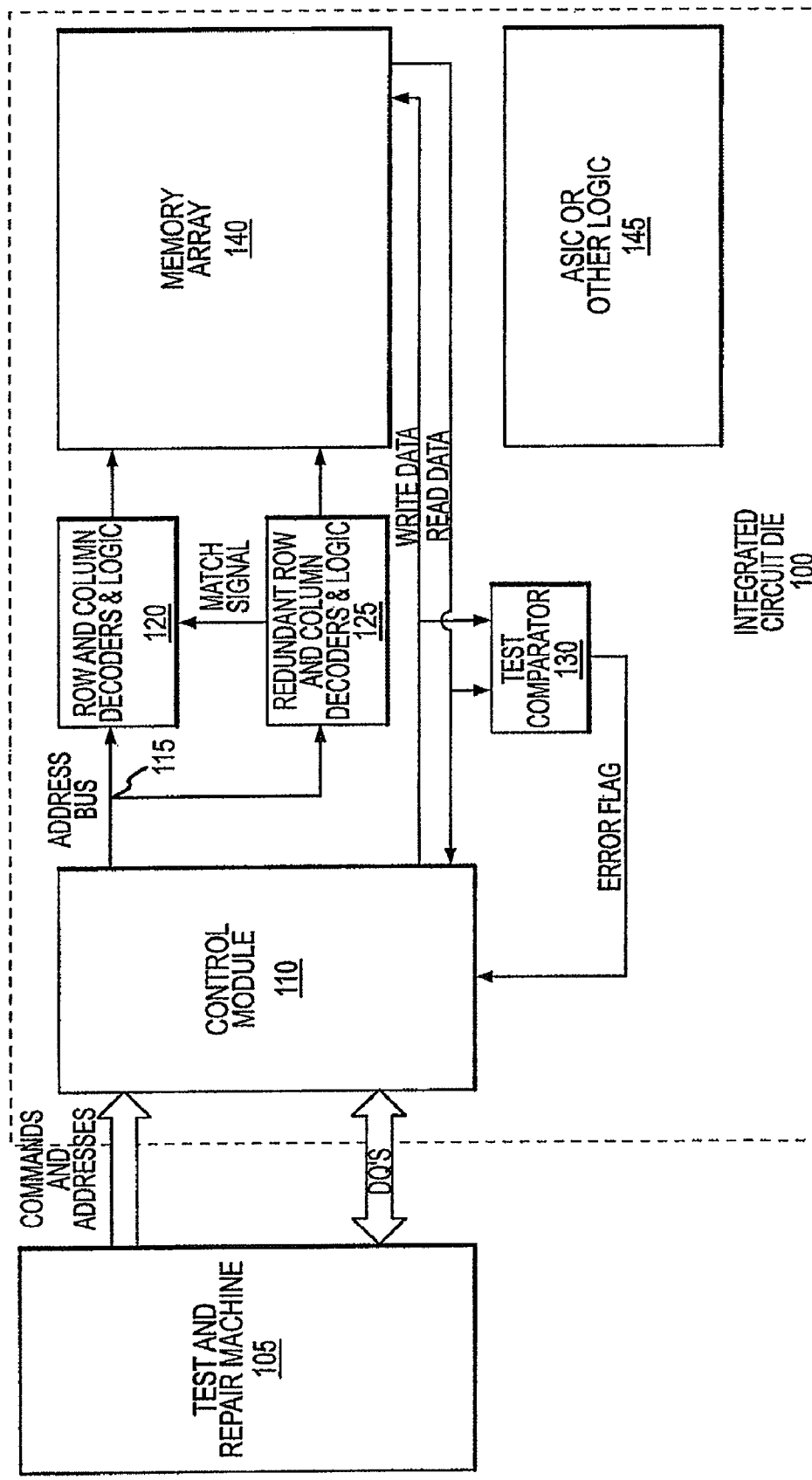
FIG. 1 is a functional block diagram depicting a prior art method of testing and repairing a semiconductor device containing memory.
Figure 2:
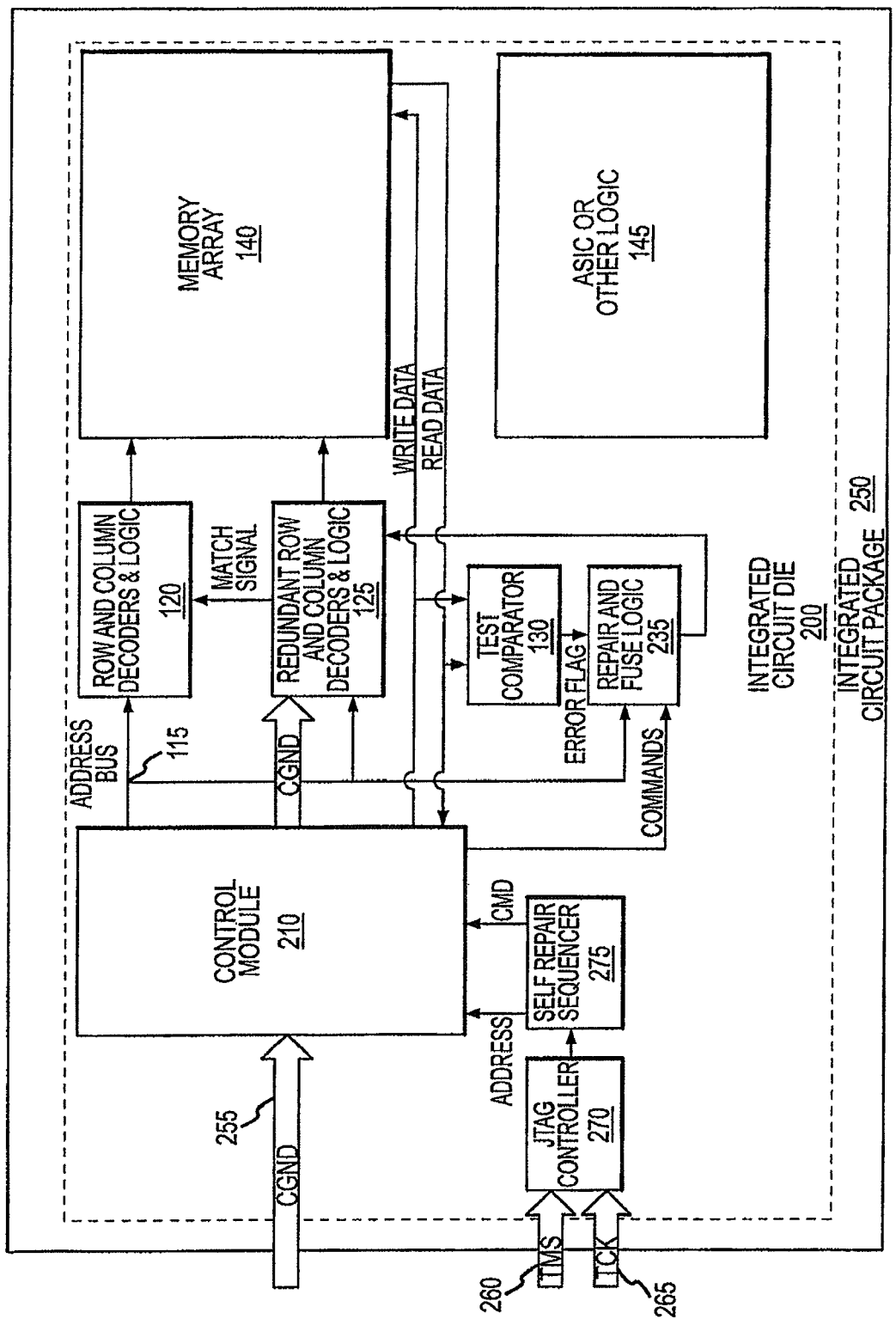
FIG. 2 is a functional block diagram of a JTAG controlled self-repair system according to an embodiment of the invention.

FIG. 2 depicts a JTAG controlled self-repair system according to one embodiment of the invention. As shown in FIG. 2, the system includes an integrated circuit die 200 that has been packaged into an integrated circuit package 250. As was discussed above, the die 200 is no longer exposed to or usable with a memory tester, laser repair machine or logic tester. Instead, the integrated circuit die 200 includes circuitry for making a permanent and non-volatile repair of a memory array 140 on the integrated circuit die 200 that is contained within the integrated circuit package 250. In particular, the JTAG controlled self-repair system includes a JTAG controller 270 and self-repair sequencer 275. The JTAG controller 270 receives clock and command signals from the IEEE 1149.1 (JTAG) standard TCK 265 and TMS 260 pins, respectively, that are external to the integrated circuit package 250. As is well known in the art, the TMS 260 pin is used to manipulate a JTAG Test Access Port (TAP) state machine. The TAP controller state machine is contained within the JTAG controller 270. The TMS 260 pin is used to step through the JTAG state-machine and, as will be discussed in more detail below, the self-repair sequencer 275 generates addresses and commands that are directed to a control module 210. The JTAG controlled self-repair system of FIG. 2 also includes an CGND 255 pin. The CGND 255 pin can be coupled to an external high-voltage supply. The voltage of this supply is greater than the operating voltage of the integrated circuit and is used to blow fuses or that create a non-volatile and permanent repair of the memory array 140.

A typical test and repair sequence using embodiments of the invention will now be described. Prior to initiating the repair sequence, the chip must be tested to locate faulty memory locations. As is known by those of ordinary skill, and as explained above, methods exist for testing an integrated circuit using built-in self test circuits (not described here). Using suitable built-in self test circuitry, the control module 210 causes data to be written to the memory array 140. When the data is subsequently read from the memory array 140, the test comparator 130 compares the read data with the expected data. If the read data and expected data do not match and error flag is generated which causes the failure address to be captured and stored within repair and fuse logic 235. Alternatively, the error flag might be used to capture or store the failure address elsewhere on the chip. Once all locations in the memory array have been tested and all failure addresses have been stored in the chip, JTAG controlled self-repair can begin.

Figure 3:
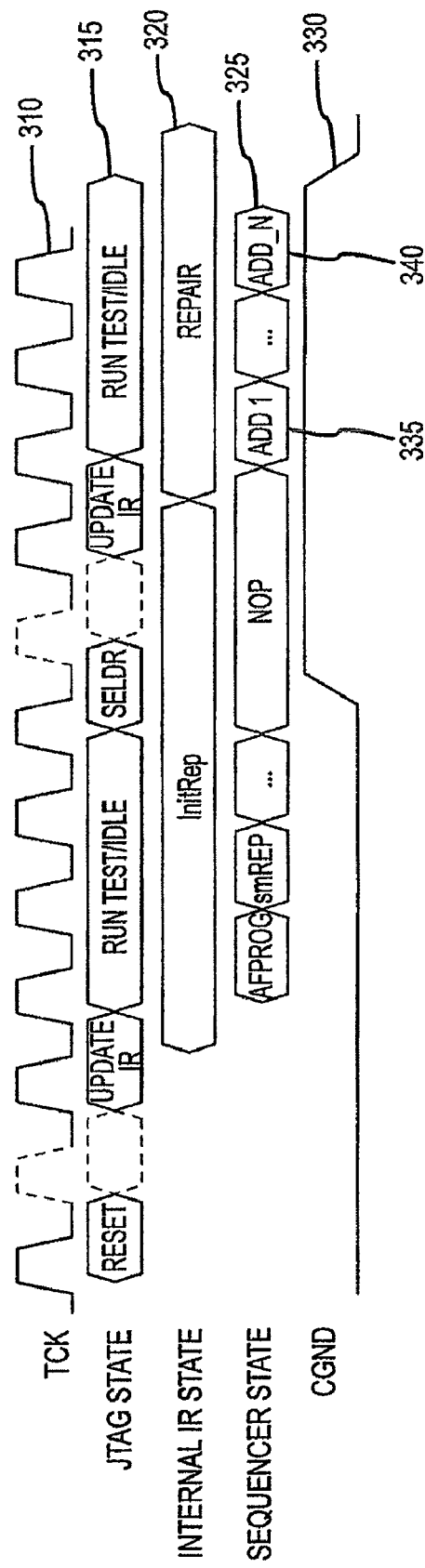
FIG. 3 is a JTAG controlled self-repair signal timing diagram illustrating the JTAG, internal command and CGND signal timing in the system of FIG. 2.

FIG. 3 depicts a JTAG controlled self-repair signal timing diagram illustrating the JTAG, internal command and CGND signal timing according to an embodiment of the invention. With further reference to FIG. 2, the self-repair sequencer 275 accepts signals from the JTAG controller 270 and generates internal repair commands and addresses. In one embodiment, the JTAG controller 270 can also generate column and row address strobe (CAS and RAS) signals (not shown). Alternatively, the control module 210 may accept commands generated by the self-repair sequencer 275 and generate the CAS and RAS signals itself. The JTAG controller 270 of FIG. 2 accepts the TCK signal 310 of FIG. 3 on the external TCK 265 pin. As is understood by one of ordinary skill, through properly timed applications of a TMS signal on the TMS 260 pin as shown in FIG. 2, the internal state of the JTAG controller 270 can be manipulated so as to create the a JTAG state 315 as shown in FIG. 3. The JTAG controller 270 issues an initialize repair command to the self-repair sequencer 275 when the JTAG state machine transitions to the 'update IR' state as is reflected by an internal IR state 320 of FIG. 3.

After the JTAG controller 270 issues the initialize repair command to enter an initialize repair mode, the self-repair sequencer 275 state enters Afprog and then smREP as shown by a sequencer state 325 signal of FIG. 3. The Afprog state enables the fuse programming logic in the repair and fuse logic 235. Likewise, the smREP state enables the repair and fuse logic 235 to automatically map redundant circuitry and select appropriate fuses to blow. At this point, the repair and fuse logic 235 selects fuse bank addresses that map the redundant row and column decoders. After the repair and fuse logic 235 has loaded the fuse bank address, the user brings the high voltage CGND signal 330 high and forces the chip to enter a repair mode.

The repair mode is entered by stepping through the JTAG step machine a second time as reflected by the JTAG state 315. Just as before, when the state machine within the JTAG controller 270 enters 'update IR', the internal IR state 320 transitions to Repair mode. While in the Repair mode, the self-repair sequencer 275 steps through each repair address that was stored during testing, Add_through Add_n 340 as needed, and issues commands that cause the repair and fuse logic 235 to blow the appropriate fuses in the fuse bank. Once all the fuses have been blown, the user brings the CGND signal 330 low and repair is complete.

The repair of the memory array is non-volatile and permanent once the fuses have been blown. After repair, the memory array 140 continues to be accessed by the ASIC or other logic 145 in the normal manner. That is, memory addresses are generated by the control module 210 which are conveyed by the address bus 115 to the row and column decoders 120. The addresses are likewise conveyed to the redundant row and column decoders and logic 125. The redundant row and column decoders and logic 125 compare the address provided on the address bus with the stored failure addresses, which is received from the repair and fuse logic 235. If there is a match, the match signal 280 is asserted which prevents the row and column decoders 120 from activating. Instead, the redundant row and column decoders 125 are activated thereby re-routing access to the redundant memory cells in the memory array 140 instead of to the faulty memory cells. Such means of repair is advantageous because the repair process must be run only one time which, as will be understood by one of ordinary skill, provides a significant power savings and likewise can be accomplished after the semiconductor devices have been packaged.

Figure 4:
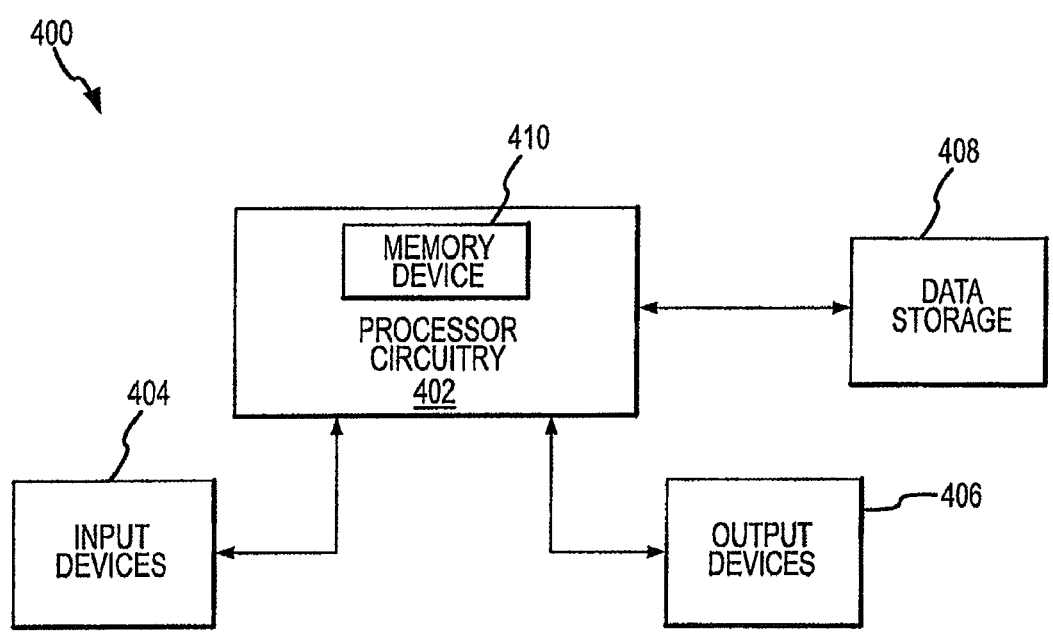
FIG. 4 is a simplified block diagram of a processor-based system according to an embodiment of the invention including the memory device containing the JTAG controlled self-repair system of FIG. 2.

FIG. 4 is a block diagram of a processor-based system 400 including processor circuitry 402 having a memory device 410. The processor circuitry 402 is coupled through address, data, and control buses to the memory device 410 to provide for writing data to and reading data from the memory device 410. The processor circuitry 402 includes circuitry for performing various processing functions, such as executing specific software to perform specific calculations or tasks. The processor-based system 400 also includes one or more input devices 404 coupled to the processor circuitry 402 to allow an operator to interface with the processor-based system 400.

Examples of input devices 404 include keypads, touch screens, and scroll wheels. The processor-based system 400 also includes one or more output devices 406 coupled to the processor circuitry 402 to provide output information to the operator. In one example, the output device 406 is a visual display providing visual information to the operator. Data storage 408 is also coupled to the processor circuitry 402 to store data that is to be retained even when power is not supplied to the processor-based system 400 or to the data storage 408. The memory device 410 contains an embodiment of the JTAG controlled self-repair system of FIG. 2, or some other embodiment of the invention, and the processor-based system 400 may direct the repair of the memory device 410 either with or without operator intervention and assistance.

From the foregoing it will be appreciated that, although specific embodiments of the invention have been described herein for purposes of illustration, it will be understood by one skilled in the art that various modifications may be made without deviating from the invention. Accordingly, the invention is not limited except as by the appended claims.

What is claimed is:

1. An apparatus, comprising:
   repair and fuse logic having fuse programming logic and configured to select and program programmable elements to repair memory;
   a control module configured to issue commands to the repair and fuse logic to enable the repair and fuse logic;
   a test access port (TAP) controller configured to enter an update IR state a first time and enter the update IR state a second time, wherein the TAP controller is configured to issue a first internal repair command to the sequencer to initialize repair responsive to entering the update IR state the first time; and
   a sequencer coupled to the TAP controller and control module, and configured to enable the fuse programming logic and enable the repair and fuse logic to select programmable elements to program, the sequencer further configured to issue commands to the repair and fuse logic to program the programmable elements responsive to the TAP controller entering the update IR state the second time.

2. The apparatus of claim 1 wherein the TAP controller is included in a controller according to the IEEE 1149.1 standard.

3. The apparatus of claim 1 wherein the sequencer comprises a self-repair sequencer configured to generate address and commands directed to the control module to cause the repair and fuse logic to program programmable elements.

4. The apparatus of claim 1 wherein the sequencer is configured to enter a repair mode responsive to the TAP controller entering the update IR state the second time.

5. The apparatus of claim 1 wherein the repair and fuse logic is configured to automatically map redundant circuitry and select appropriate programmable elements to program.

6. The apparatus of claim 1 wherein the sequencer is configured to enter a first state to enable the fuse programming logic and enter a second state to enable the repair and fuse logic to select programmable elements to program.

7. The apparatus of claim 6 wherein the repair and fuse logic is configured to blow fuses in a fuse bank to program the selectable programmable elements.

8. The apparatus of claim 1 wherein the sequencer is further configured to step through stored repair addresses and issue commands to cause the repair and fuse logic to program the programmable elements.

9. A method of repairing memory, comprising:
   entering an update IR state a first time;
   issuing an initialize repair command to a self-repair sequencer in a memory;
   mapping redundant circuitry;
   selecting programmable elements to program;
   entering the update IR state a second time; and
   programming selected programmable elements to repair the memory responsive to entering the update IR state the second time.

10. The method of claim 9, further comprising stepping through stored repair addresses.

11. The method of claim 9 wherein programming selected programmable elements comprises blowing fuses.

12. The method of claim 9 wherein mapping redundant circuitry and selecting programmable elements to program comprises selecting fuse bank addresses that map redundant row and column decoders.

13. The method of claim 9 wherein mapping redundant circuitry and selecting programmable elements to program comprises enabling repair and fuse logic to automatically map redundant circuitry and select fuses to blow.

14. The method of claim 9, further comprising entering an initialize repair mode responsive to issuing the initialize repair command.

15. The method of claim 9, further comprising entering a repair mode responsive to entering the update IR state the second time.

* * * * *